United States Patent [19]

Pomante

[11] 4,380,115
[45] Apr. 19, 1983

[54] METHOD OF MAKING A SEMICONDUCTOR DEVICE WITH A SEAL

[75] Inventor: Louis N. Pomante, Lansdale, Pa.

[73] Assignee: Solid State Scientific, Inc., Montgomeryville, Pa.

[21] Appl. No.: 293,200

[22] Filed: Aug. 17, 1981

Related U.S. Application Data

[62] Division of Ser. No. 100,905, Dec. 6, 1979, abandoned.

[51] Int. Cl.³ .................................. H01L 23/02
[52] U.S. Cl. ................................... 29/588; 29/577 R
[58] Field of Search ............ 29/588, 577 R, 577 IC; 357/52, 53, 84

[56] References Cited

U.S. PATENT DOCUMENTS

| | | | |
|---|---|---|---|
| 3,325,586 | 6/1967 | Suddick | 29/588 |
| 3,383,568 | 5/1968 | Cunningham | 29/588 |
| 3,710,204 | 1/1973 | Batz | 357/53 |

FOREIGN PATENT DOCUMENTS 1204805  9/1970  United Kingdom ............ 357/53

OTHER PUBLICATIONS

Abbas et al.; "Doped Polycrystalline Field Shield Process", IBM Tech. Disclosure; vol. 15, No. 6; Nov. 1972.

*Primary Examiner*—L. Dewayne Rutledge
*Assistant Examiner*—David A. Hey
*Attorney, Agent, or Firm*—Ratner & Prestia

[57] ABSTRACT

A seal for a semiconductor device in which the semiconductor has a major surface with a metal layer overlying the major surface. An insulating layer of glass is formed on the metal layer and a passive sealing silicon layer is formed on the glass layer for protecting the device from contamination.

11 Claims, 5 Drawing Figures

METHOD OF MAKING A SEMICONDUCTOR DEVICE WITH A SEAL

This application is a division of application Ser. No. 100,905, filed Dec. 6, 1979, now abandoned.

BACKGROUND OF THE INVENTION

A. Field of the Invention

This invention relates to semiconductor devices and in particular to a sealing coating for protecting the device from contamination.

B. Prior Art

In the fabrication of integrated circuits, a wafer of monocrystalline silicon is variously etched and subjected to diffusion or implantation of controlled concentrations of impurities to establish desired topology and various N-type, P-type and insulating regions which form the multiplicity of active and passive semiconductor structures. A final step in fabricating an operating device is the laying on of an aluminum film pattern to establish metallic interconnections between the structures such that a desired circuit is produced. Portions of this pattern are terminated at bonding pads to which wires are later attached; the wires extending to terminal pins of the completed package.

The device at this stage of fabrication is functionally complete and could, with appropriate mechanical support and termination, operate as part of an electronic assembly such as a television receiver, calculator, etc. Its usefulness would be shortlived, however, because environmental contamination would profoundly affect the character of the semiconductor junctions and the regions abutting them. Specifically, sodium ions and moisture present in the atmosphere would easily diffuse into the silicon and radically change the electrical characteristics of the device. Such influences would cause the demise of the device in only hours at ordinary temperatures.

It is, therefore, common practice to deposit a layer of silicon dioxide (SiO$_2$) which in its amorphous form is essentially glass. This layer protects the underlying silicon from contact with atmospheric gases and vapor. Furthermore, it protects the wafer surface and its metalization against abrasion and gross contaminants such as dust particles which might be introduced during the cutting of the wafer into individual chips.

If the chip is then housed in an hermetic seal, the SiO$_2$ passivating layer has usually been sufficient. The chip has remained protected against residual contamination within the enclosure which is in turn protected against further contamination by the seal. However, hermetic sealing is relatively costly and thus for most consumer and industrial products, the completed glass sealed chips are encapsulated in plastic following the bonding of the wire leads. The plastic offers adequate mechanical protection and serves to exclude gross contaminants. However, the plastic is semi-permeable and moisture has diffused through it over periods of time. The moisture has also transported metallic ions, typically sodium. The layer of passivating glass has protected the device as described above against these contaminants over a period ranging from weeks to years depending on temperature, electrical biases and the thickness and constitution of the glass itself.

Glass containing about 3 to 10 percent, typically 5% to 7%, of phosphorous has been enhanced in its ability to trap sodium ions. However, these ions over a lengthy period have diffused through the glass in sufficient numbers to alter the electrical characteristics of a device. Such diffusion rates are enhanced at higher chip temperatures and by electric fields which are produced by operating potential differences between various regions of the chip surface.

Accordingly, an object of the present invention is protecting the major surface of a semiconductor device from moisture and metallic ions present in the atmosphere.

SUMMARY OF THE INVENTION

A seal for a semiconductor device and a method therefor in which the semiconductor device has a major surface. A passive sealing silicon layer is formed overlying the major surface of the semiconductor body thereby to protect the device from contamination.

DETAILED DESCRIPTION

Figure 1:
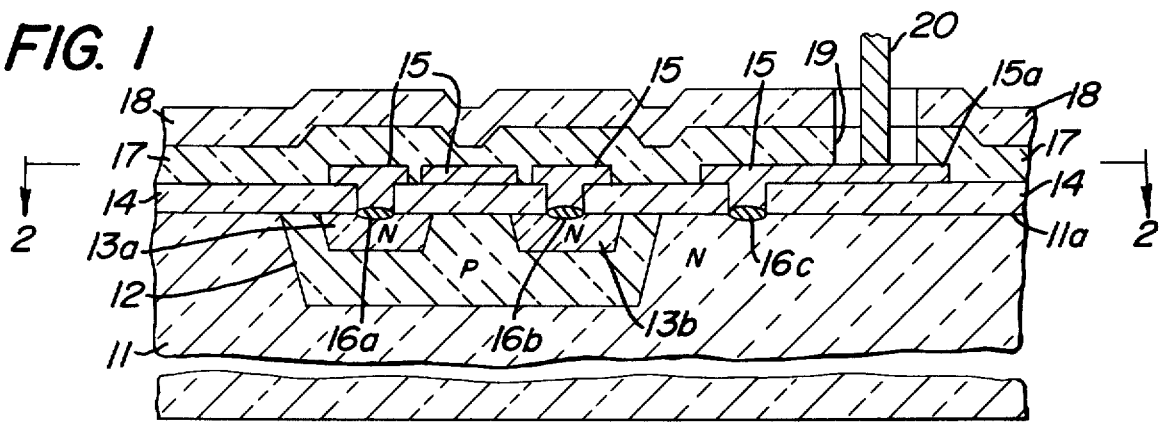
FIG. 1 is a cross-section of a portion of a semiconductor device having a layer of passivating glass and a sealing layer of silicon over the glass in accordance with one embodiment of the invention.

Referring now to FIG. 1, there is shown a cross-section of a portion of a CMOS semiconductor device or integrated circuit 10. Using well known processes, a circuit is fabricated starting with a body of silicon 11 having a major surface 11a and having a specified concentration of N-type impurities. The break shown in the representation of the wafer thickness is present because the thickness is very large compared to the dimensions of the diffused and deposited regions which constitute the active portion of the circuit.

Using standard photolithographic techniques, various masking, etching and oxidation steps follow which lead, for example, to the production of a P-type region 12 into which further diffusions resulting in N-type regions 13a-b are produced. It will be understood that many discrete regions may be formed and provided with other various circuit elements such as resisters, diodes, transistors, etc. Additional oxidation and etching steps follow which provides an insulating layer of silicon dioxide 14 having windows through which a subsequently applied film of a suitable metal such as aluminum 15 extends to make contact with the silicon substrate. In conventional manner, aluminum deposition is effected by evaporation of the metal onto substrates which are at room temperature or up to about 300° C. in a high vacuum. Under these conditions, the aluminum 15 interacts very little with silicon in the areas not protected by oxide layer 14.

In the subsequent masking and etching step, the aluminum film 15 is divided into many individual traces that interconnect specific regions. For circuit nodes which are to be connected externally, these traces lead to extended metallization areas such as indicated by 15a in FIGS. 1 and 2.

Following the metal pattern definition, the aluminum is "sintered" or "alloyed". In a conventional example, sintering takes place ranging from about 400° C. to 500° C. for from about 20 to 40 minutes. In these examples, the ambient is nitrogen or hydrogen or a mixture of nitrogen and hydrogen. The foregoing results in alloyed regions 16a–c where the silicon is not protected by oxide layer 14. It will be understood that higher alloying temperatures much above about 500° C., for example, would result in rapid spreading of the alloyed regions to the point where regions 16a–c would extend completely through the N-regions 13a,b to thereby contact the underlying P-region 12. This would result in an undesirable shorting of the P-N junctions.

For the next step, an insulating layer is then deposited over the entire oxide layer 14 and aluminum layer 15 as well as metallized areas 15a. A passivating layer of amorphous glass, ($SiO_2$) has been used as the insulating layer 17 where the amorphous glass has a phosphorous content, as previously described, in the range of about 3 to 10 percent, as operative limits, and about 5-7 percent preferred limits. The glass cannot be deposited at a temperature much above about 500° C. or there results the above described undesirable shorting of the P-N junctions. In other examples, the insulating layer is formed of glass without phosphorous and is also formed of silicon nitride ($Si_3N_4$).

Figure 3:
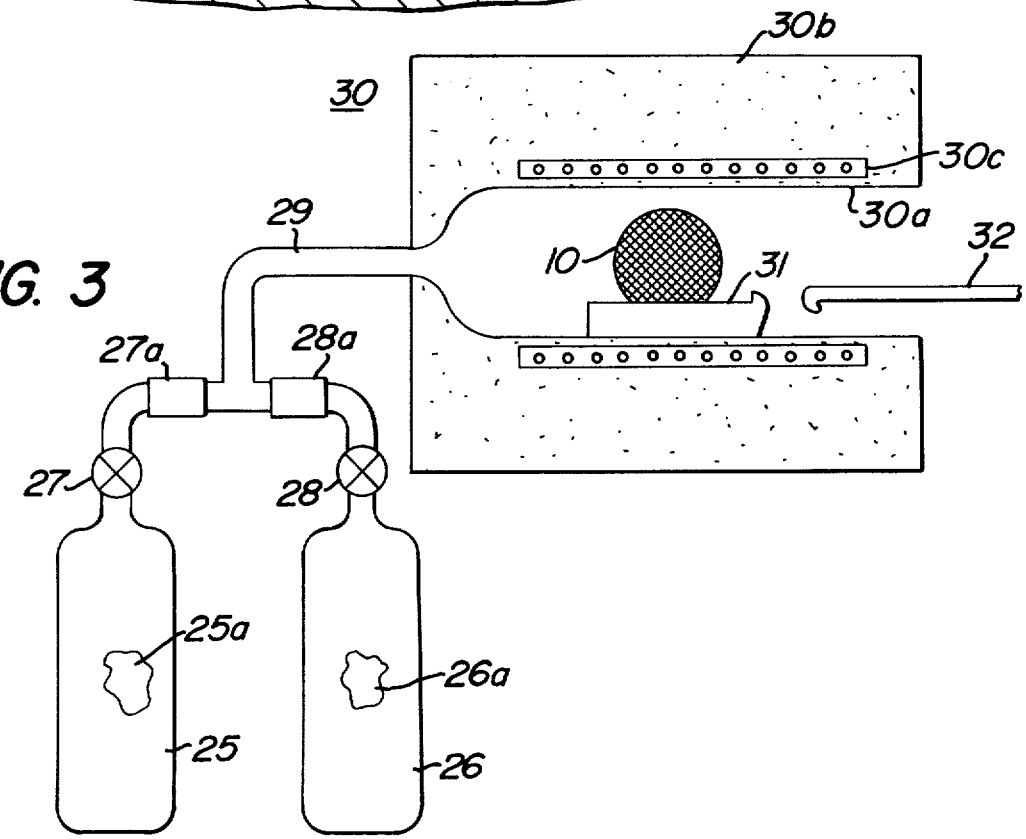
FIG. 3 is a schematic diagram of a diffusion furnace in which the sealing layer of silicon is formed on the semiconductor device of FIGS. 1 and 2.

Following deposition of insulating layer 17, a passive sealing or protective layer 18 is deposited over the entire layer 17 by placing chip 10 in a diffusion furnace shown in FIG. 3. Diffusion furnace 30 comprises a chamber 30a surrounded by refractory 30b within which thermostatically controlled electric heating coils 30c are embedded. The atmosphere within the chamber 30a is supplied with a mixture of silane ($SiH_4$) and nitrogen ($N_2$) gases. A tank 25 containing nitrogen 25a and a tank 26 containing 3% silane in nitrogen 26a are attached to a manifold 29 which leads to the furnace chamber 30a. The flow rates of the nitrogen and silane as indicated by flow meters 27a, 28a are controlled by valves 27 and 28 respectively and commensurate with the desired deposition rate. One or more wafers 10 may be supported in an upright position on a quartz or silicon carrier 31 which is inserted into or removed from the furnace by a conventional manually or automatic or machine operated rod 32. Wafer 10 is heated in furnace 30 for the growth of a silicon layer. The temperature of furnace 30 is in a range of 450° C. to 525° C., approximately, where a temperature of about 475° C. is a preferred temperature. The rate of growth of silicon layer 18 goes up sharply with temperature and thus for temperatures below about 450° C. in furnace 30 a useful silicon layer may be deposited but the growth process is uneconomically long. For temperatures below about 425° C., from run to run, the silicon in some wafers 10 in some runs does not deposit at all.

The degree of silicon aluminum alloying also increases sharply with temperature. Thus, at the upper limit of the temperature range at about 525° C., from run to run, some of the wafers 10 in some runs may have their P-N junction regions near the aluminum-silicon contact points destroyed. Above about 525° C., there is an increase in the destruction of the wafers with temperature in furnace 30.

At the preferred temperature of about 475° C., depositions of passive sealing silicon layers have been made in the range of 500-1000 A, approximately. This range has been found to be a preferred range of silicon thickness and provides contamination protection with a compromise between a more costly thicker silicon layer while at the thinner limit, a lower device reliability. For silicon layers thinner than 500 A, the saving is only a relatively shorter duration of deposition time. In addition, for these layers thinner than 500 A, during fabrication the plus or minus variation in thickness from run to run may result in some undesirably thin silicon thicknesses on some of the wafers.

In other examples, the silicon is formed in the range of 500-3000 A, approximately. The silicon film is desirably not very conductive and provides a high electrical resistivity of approximately 0.25 megohm-centimeter. Thus, a relatively thin passive silicon layer 18 provides a very high resistance but as the film becomes thicker, the resistance decreases. If the silicon layer is of such a thickness that the resistance has substantially decreased, a problem may arise if wire 20 would accidentally touch the silicon layer.

Examples of silicon layer deposition rates in furnace 30 at temperatures ranging from 450° C. to 525° C. at the indicated silane nitrogen flow rates in a 100 mm. diameter tube are set forth in the following table.

TABLE 1

| Furnace Temperature °C. | 3% Silane in Nitrogen Rate liter/min. | Nitrogen Rate liter/min. | Rate of Silicon Layer Growth A/hr |
|---|---|---|---|
| 450 | 2.7 | 6.8 | 1,600 |
| 475 | 2.7 | 6.8 | 5,000 |
| 500 | 2.7 | 6.8 | 8,500 |
| 525 | 2.7 | 6.8 | 13,000 |

Examination of wafers fabricated in the foregoing examples of Table 1 show silicon layer 18 to be polycrystalline.

Figure 2:
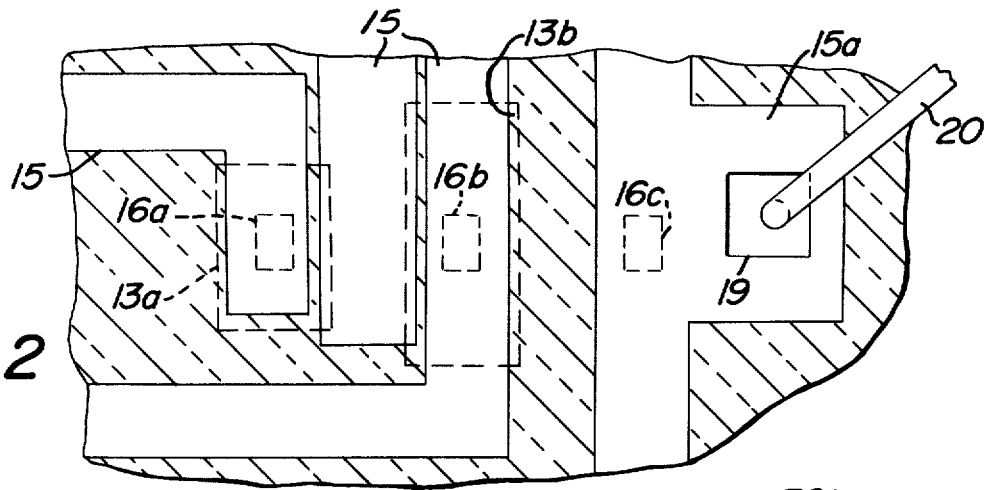
FIG. 2 is a plan view of the elements shown in the cross-section of FIG. 1.

By the selective etching of silicon layer 18 and insulating layer 17, a window 19 as shown in FIGS. 1, 2 is formed through layers 18 and 17 to allow passage of terminal wire 20 for connecting to node 15a.

In this manner, there is produced a semiconductor device 10 having a silicon layer 18 for protecting the device from contamination from moisture and metallic ions. While device 10 is shown as a portion of a CMOS device, it will be understood that silicon layer 18 may be used in connection with other semiconductor devices requiring such protection from contamination.

Figure 4:
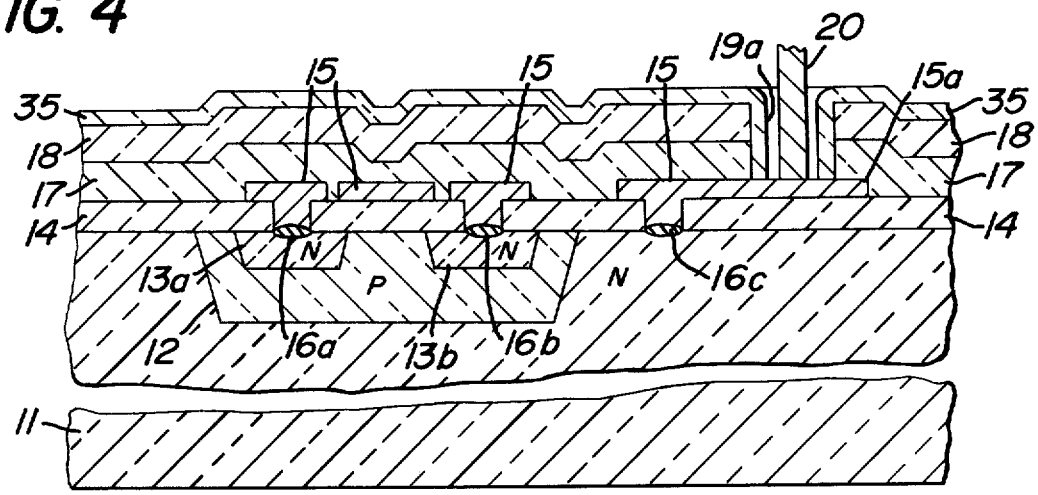
FIG. 4 is a cross-sectional view of another embodiment of the invention in which a second layer of glass is applied over the sealing layer of silicon.

FIG. 4 illustrates another embodiment of the invention in a CMOS semiconductor device 10a. All of the fabrication steps up to and including the selective etching of a window in silicon layer 18 and insulating $SiO_2$ layer 17 are the same as those described previously. In this embodiment, before terminal wire 20 is attached, an additional layer 35 of amorphous glass is deposited over the top of the device such that the edges of this layer at window 19a flow down to coat the sides of the window thus protecting silicon layer 18 from contact with wire 20. By selective etching, layer 35 must be opened over the aluminum pad to allow wire 20 to be attached. Alternatively, the vertical section of layer 35 within window 19a may also be etched away leaving the edges of layers 17, 18 and 35 extending within window 19a. In this alternative, layer 35 no longer completely protects layer 18 from contact with wire 20. By enclosing the silicon 18 in a glass "sandwich" between layers 17 and 35, the silicon is further protected against abrasion and chemical attack which might occur during and after installation within the encapsulating plastic.

Figure 5:
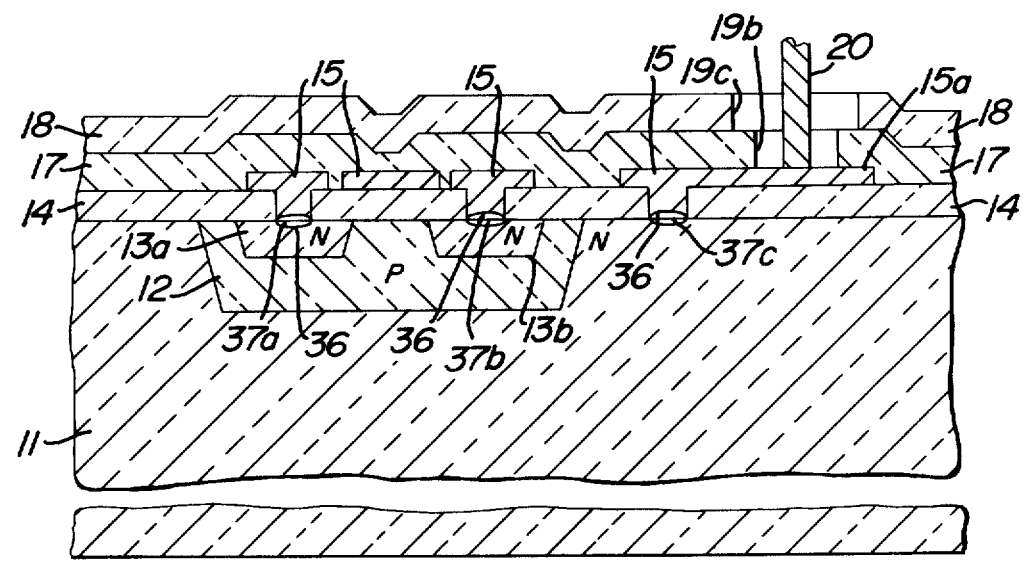
FIG. 5 is a cross-section of a third embodiment of the invention.

FIG. 5 illustrates yet another embodiment of the invention in CMOS device 10b. Fabrication of this embodiment is similar to that of the embodiment illustrated in FIGS. 1 and 2. However, in conventional manner, a thin film 36 of nichrome is disposed during the fabrication of the device, as illustrated in FIG. 5, on top of the active silicon regions 11, 12, and 13 prior to the deposition of aluminum layer 15. During the "sintering" or "alloying" process, trimetallic alloy regions 37a-c are formed where the aluminum meets the silicon due to the presence of the nichrome film 36. This inhibits the alloying of aluminum into the silicon and allows the wafer to be subjected to higher temperatures, for example over about 525° C., which would allow the silicon layer to be deposited to the preferred thickness of 500 to 1,000 A units in a shorter time thus greatly increasing the manufacturing through put.

Alloying can also be inhibited by depositing aluminum silicon instead of pure aluminum for the interconnects. In this case, regions 15 in FIG. 1 would be of an aluminum silicon composition as deposited. The aluminum now being partially saturated with silicon will not consume as much silicon from the device contact areas when alloyed. This in turn would allow a higher deposition temperature for silicon layer 18.

In the embodiment of FIG. 5, it will be noted that window 19b has been etched wider in area 19c which is defined by silicon layer 18. In this manner, there is substantially decreased any possibility of contact between terminal wire 20 and layer 18.

It is understood that the above described arrangements and embodiments are merely illustrative of the many specific embodiments which can be devised to represent application of the principles of the invention. For example, passive silicon layer 18 can also be deposited by means of evaporation techniques, sputtering techniques and RF plasma methods. In these examples, the wafer is maintained at about room temperature or slightly higher and the silicon layer also results in a polycrystalline structure. However, the grain size can become so small so as to characterize the polycrystalline structure as amorphous.

What is claimed is:

1. A method of fabricating a semiconductor device comprising the steps of:
   (a) forming a layer of metal overlying a major surface of a semiconductor body, and removing parts of said metal layer to leave a pattern thereof overlying said semi-conductor surface,
   (b) forming an insulating passivating layer of silicon dioxide overlying and contacting said patterned metal layer,
   (c) forming a passive sealing silicon layer overlying and contacting the insulating layer by placing said semi-conductor device with said patterned metal layer and insulating layer formed thereon in a chamber containing an atmosphere including a gas which decomposes and deposits silicon at a temperature below 525° C. for a time duration sufficient to form a deposit of silicon in the range of 500 to 3000 A thick approximately, and
   (d) etching windows in the sealing silicon layer and insulating layer to provide openings to receive terminal connections to said metal layer.

2. The method of claim 1 in which step (c) includes forming the sealing silicon layer in a chamber at a temperature of about 475° C.

3. The method of claim 1 in which step (c) includes forming the sealing silicon layer for a time duration sufficient to provide a thickness in a range of 500 to 1000 A approximately.

4. The method of claim 1 in which the sealing silicon layer is polycrystalline silicon.

5. A method of fabricating a sealed semiconductor device, as recited in claim 1, wherein said chamber atmosphere also includes nitrogen.

6. A method of fabricating a sealed semiconductor device, as recited in claim 1, wherein a second passivating layer is deposited over said sealing silicon layer.

7. The method of claim 1 in which step (c) includes forming the sealing silicon layer directly on and contacting the passivation layer.

8. The method of claim 7 in which there is provided the further step of forming an additional passivation layer contacting the sealing silicon layer after step (c).

9. A method of fabricating a seal for a semiconductor device having an electrical circuit thereon, said device including:
   a patterned layer of metal overlying a major surface of said semiconductor body, said patterned metal layer comprising an active, conductive element of said circuit,
   said device further including a passivation layer overlying the patterned layer of metal,
   said method comprising placing said semiconductor device with said metal layer and passivation layer thereon in a chamber containing an atmosphere including silane at a temperature range of 425° C. to 525° C. to deposit, by thermal decomposition of said silane, a silicon layer overlying said passivating layer, said deposited silicon layer being adapted to be passive and inactive in the electrical circuit or field shielding function of the semiconductor device and effective as a seal to preclude intrusion of contaminants into said device.

10. The method of claim 9 in which the passivation layer is formed of glass.

11. The method of claim 1 in which step (a) comprises forming a layer of aluminum.

* * * * *